(12) United States Patent
Canegallo et al.

(10) Patent No.: US 8,773,162 B2
(45) Date of Patent: Jul. 8, 2014

(54) COMMUNICATION CELL FOR AN INTEGRATED CIRCUIT, CHIP COMPRISING SAID COMMUNICATION CELL, ELECTRONIC SYSTEM INCLUDING THE CHIP, AND TEST APPARATUS

(75) Inventors: Roberto Canegallo, Rimini (IT); Roberto Cardu, Bologna (IT); Mauro Scandiuzzo, Trento (IT); Salvatore Valerio Cani, Campobello di Licata (IT); Luca Perugini, Bologna (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 12/980,832

(22) Filed: Dec. 29, 2010

(65) Prior Publication Data
US 2011/0171906 A1 Jul. 14, 2011

(30) Foreign Application Priority Data
Dec. 30, 2009 (IT) .............................. TO2009A1057

(51) Int. Cl.
*H03K 19/173* (2006.01)
*H03K 19/0175* (2006.01)

(52) U.S. Cl.
USPC .................................. 326/38; 326/82; 326/86

(58) Field of Classification Search
USPC ............................................. 326/37–47, 101
See application file for complete search history.

(56) References Cited

U.S. PATENT DOCUMENTS

| | | | |
|---|---|---|---|
| 5,952,951 A * | 9/1999 | Fujino | 341/159 |
| 5,973,538 A * | 10/1999 | Shou et al. | 327/344 |
| 6,600,325 B2 | 7/2003 | Coates et al. | |
| 6,828,830 B2 * | 12/2004 | Doyle | 327/99 |
| 6,885,202 B2 | 4/2005 | Slupsky | |
| 7,109,730 B2 | 9/2006 | Slupsky | |
| 7,181,663 B2 | 2/2007 | Hildebrant | |
| 2004/0075453 A1 | 4/2004 | Slupsky | |
| 2004/0178819 A1 * | 9/2004 | New | 326/40 |
| 2007/0126429 A1 | 6/2007 | Tanaka | |
| 2010/0039137 A1 * | 2/2010 | Okyay et al. | 326/38 |

FOREIGN PATENT DOCUMENTS

WO 2007146582 12/2007

OTHER PUBLICATIONS

European Search Report for European Patent No. EP10197444, European Patent Office, Jun. 29, 2011, pp. 3.

* cited by examiner

*Primary Examiner* — Thienvu Tran
(74) *Attorney, Agent, or Firm* — Graybeal Jackson LLP

(57) ABSTRACT

An embodiment of communication cell for enabling data communication between an integrated circuit and an electronic unit distinct from the integrated circuit, comprising a contact pad unit, configured for capacitively coupling, in a first operating condition of said communication cell, to the electronic unit for receiving an input signal from said electronic unit, and for ohmically coupling, in a second operating condition of said communication cell, to the electronic unit for receiving the input signal; a receiver device, including signal-amplifying means, coupled between said contact pad unit and said integrated circuit, configured for receiving the input signal and generating an intermediate signal correlated to the input signal; signal-selection means receiving the intermediate signal, the input signal, and providing an output signal which is the intermediate signal during the first operating condition, and the input signal during the second operating condition; and an input stage, connectable between the integrated circuit and the output terminal of the signal-selection means, configured for receiving the output signal and providing the output signal to the integrated circuit.

46 Claims, 9 Drawing Sheets

COMMUNICATION CELL FOR AN INTEGRATED CIRCUIT, CHIP COMPRISING SAID COMMUNICATION CELL, ELECTRONIC SYSTEM INCLUDING THE CHIP, AND TEST APPARATUS

PRIORITY CLAIM

The instant application claims priority to Italian Patent Application No. TO2009A 001057, filed Dec. 30, 2009, which application is incorporated herein by reference in its entirety.

TECHNICAL FIELD

An embodiment relates to a communication cell for an integrated circuit, to a chip comprising said communication cell, to an electronic system including said chip, and to a test apparatus.

BACKGROUND

As is known, an integrated device or a generic electronic circuit generally comprises a plurality of input/output communication cells, which have the function of communication-interface means and are provided in the form of pads, which are coupled to a corresponding circuit configured for enabling a bidirectional communication (or, alternatively, only a communication in reception or sending of data) from the integrated device to the outside and vice versa. In the following description, the term "communication cell" refers to the pad and to the unidirectional-communication circuit (input or output) or bidirectional-communication circuit (input and output) coupled to said pad.

Communication cells of a known type may be used, for example, for connecting components of an integrated device or of a generic electronic circuit with elements external to the circuit itself (for example, for supplying control signals to the integrated device or to the electronic circuit).

FIG. 1 is a schematic circuit representation of a conventional communication cell 1, of a digital type. The communication cell 1 is of an input/output (I/O) type; i.e., it can function both in the input mode (in this case it receives a signal supplied thereto from outside) and in the output mode (it supplies at output a signal, for example a signal of response to the input signal).

In greater detail, the communication cell 1 comprises an input circuit 6 including a signal-stabilization circuit 8, for example a Schmitt trigger, coupled to an interface node 4 (which is in turn coupled to the pad) from which it receives an input signal, and a buffer circuit 10 coupled between the signal-stabilization circuit 8 and an output port 11 of the communication cell 1. The input signal is generated by an electronic system 5, distinct from the communication cell 1, for example formed on a chip which is different from the chip wherein the communication cell 1 is formed.

The buffer circuit 10 is interfaced via the output port 11 with a generic electronic circuit or with an integrated device 7, for supplying the input signal received at the node 4 to the generic electronic circuit or integrated device 7.

For example, the electronic system 5 may be a test station configured to generate a test signal (i.e., the input signal) for testing the functionalities of the integrated device 7. The communication cell 1 acts as an interface between the test station and the integrated device 7. The test signal is provided to the communication cell 1 through a probe in ohmic contact with the pad coupled to the interface node 4.

The communication cell 1 further comprises a load-driving circuit 2, which, for example, includes a buffer, configured for receiving, via an input port 3 of the communication cell 1, a signal coming from the generic electronic circuit or integrated device 7.

As said, known techniques for carrying out testing of an electronic circuit envisage the use of probes of a mechanical type, configured for contacting respective pads of the communication cell 1. Said mechanical probes may be arranged in direct contact (ohmic contact) with the pad coupled to the external interface 4 of the communication cells 1 for supplying test signals to an electronic circuit or integrated device 7 coupled to the communication cell 1, and acquiring response signals from the circuit or integrated device 7 itself. The response signals may be used to check the operating state of the circuit or integrated device 7 under test. Access to the communication cells 1 by means of mechanical probes, however, may cause damage to the pad of the test communication cell 1, due to the physical contact that is set up between the probe and the corresponding pad. In addition, the use of contact probes may not enable analysis of the real operation of the circuit under test when said circuit operates at high frequency (for example, in the case of RFID devices, devices operating at radiofrequency, etc.).

To overcome the aforementioned disadvantages, contactless probing through capacitive coupling has been provided, for example as disclosed in U.S. Pat. No. 6,600,325, which is incorporated by reference. Document U.S. Pat. No. 6,600,325 discloses a system for capacitively probing electrical signals within an integrated circuit. This system operates by placing a probe conductor in close proximity to, but not touching, a target conductor within the integrated circuit. In this position, the probe conductor and the target conductor form a capacitor that stores a charge between the probe conductor and the target conductor. Next, the system detects a change in a probe voltage on the probe conductor caused by a change in a target voltage on the target conductor, and then determines a logic value for the target conductor based on the change in the probe voltage.

Another non contact tester is provided by U.S. Pat. No. 6,885,202, which is incorporated by reference, in particular for electronic circuits. The non contact tester consists of an electronic circuit and independent scanning head, in combination. The electronic circuit includes a microfabricated wireless I/O cell and means for sending and receiving signals via the wireless I/O cell. The independent scanning head has a wireless I/O cell that is compatible with the wireless I/O cell on the electronic circuit. This enables data to be exchanged with the electronic circuit to confirm proper functioning of the electronic circuit.

SUMMARY

Contactless communication cells belonging to known contactless probing systems may have the disadvantage that they cannot be used with already existing contact probing systems, limiting their usability to specifically designed contactless probing systems.

An embodiment of a communication cell for an integrated circuit, a chip comprising said communication cell, an electronic system including said chip, and a test apparatus overcome the problems of the known art.

BRIEF DESCRIPTION OF THE DRAWINGS

At least one embodiment is now described, purely by way of non-limiting example, with reference to the attached drawings, wherein.

DETAILED DESCRIPTION

Figure 1:
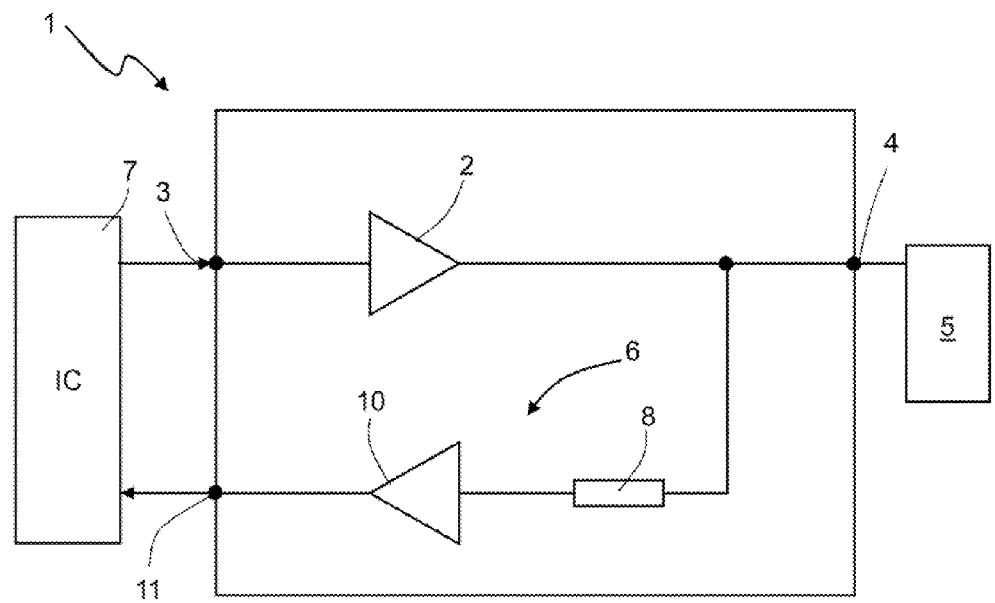
FIG. 1 shows a circuit diagram of a conventional communication cell.
Figure 2:
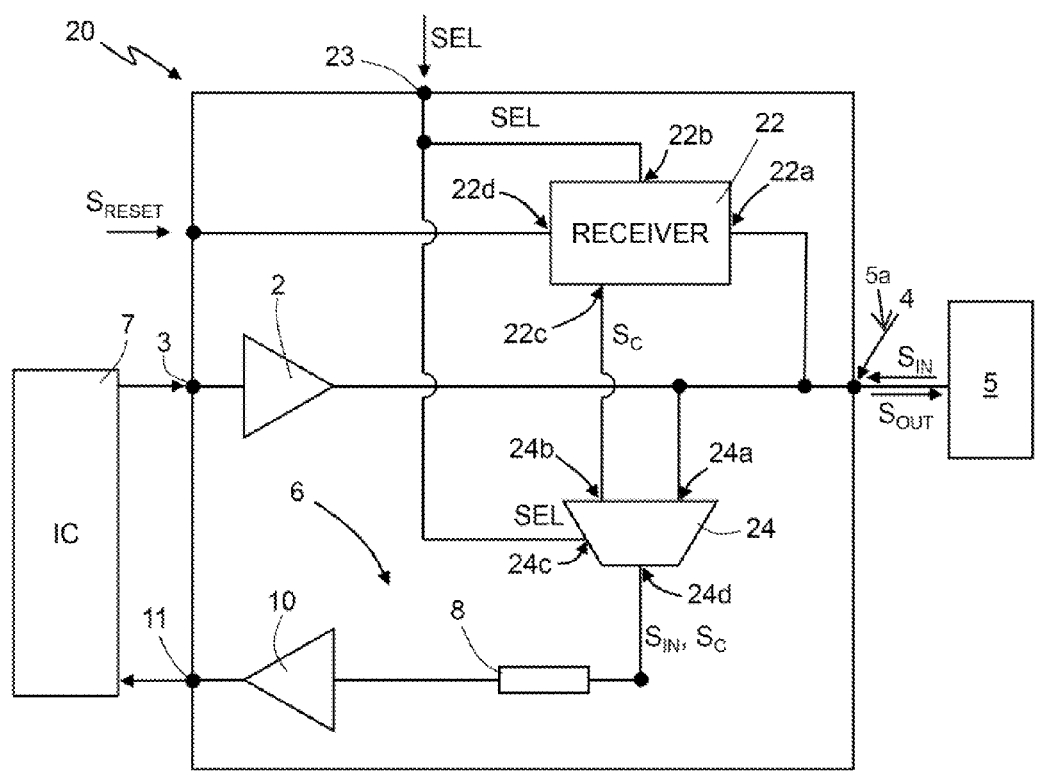
FIG. 2 shows a circuit diagram of a communication cell according to an embodiment.

FIG. 2 shows a communication cell 20 according to an embodiment of the present disclosure. In particular, the communication cell 20 is of an input/output (I/O) type. Elements of the communication cell 20 that are similar to respective elements of the communication cell 1 of FIG. 1 are not described any further and are designated in FIG. 2 using the same reference numbers.

The communication cell 20 extends the functionalities of the communication cell 1 and is configured for enabling two coupling modes with an external node (distinct from the communication cell 20): a direct-contact mode (ohmic contact); and a contactless (wireless) mode. In particular, the contactless mode enables a coupling of a capacitive type between the interface node 4 (which, for the sake of the present embodiment, may be considered coincident with the pad) and generic means for accessing the communication cell 20. Such a generic means (e.g., a probe 5A) may belong to the electronic system 5 (e.g., a tester), and may be provided, for example, with its own pad designed to enable a capacitive coupling with the pad of the communication cell 20.

In order to enable operation in contactless mode, in particular to acquire signals at input to the communication cell 20 when operating in contactless mode, the communication cell 20 comprises a receiver device 22. The receiver device 22 includes an input port 22a coupled to the interface node 4, from which it receives an input signal $S_{IN}$ (for example a voltage signal), of a digital type; a first control input 22b, for receiving a control signal SEL, configured to enable or disable operation of the receiver device 22; an output port 22c, configured for output from the receiver device 22 an intermediate signal $S_C$, of a digital type, correlated to the input signal $S_{IN}$ (as further explained hereinafter); and a second control input 22d, for receiving a reset signal $S_{RESET}$ configured for resetting the intermediate signal $S_C$ at a pre-defined value (for example, a low logic value or a high logic value).

The control signal SEL is generated by an appropriate control logic (not shown), external to the communication cell 20 and interfaced with the communication cell 20 via an input port 23 of the communication cell 20. The control signal SEL may be, for example, a binary digital signal, having a first logic value enabling operation of the receiver device 22 and a second logic value disabling operation of the receiver device 22. The control signal SEL may be generated by an integrated logic, or may be set, during the design stage, at a fixed value, according to whether it is desired to use the communication cell 20 in ohmic-contact mode only (the control signal SEL has a logic value so as to disable operation of the receiver device 22) or in contactless mode only (the control signal SEL has a logic value so as to enable operation of the receiver device 22).

The communication cell 20 further comprises a signal-selector device 24, in particular a multiplexer device (MUX), including a first input 24a, coupled to the interface node 4 for receiving the input signal $S_{IN}$; a second input 24b, coupled to the output port 22c of the receiver device 22 for receiving the intermediate signal $S_C$; a control gate 24c, coupled to the input port 23 for receiving the control signal SEL; and an output port 24d, configured to output from the signal-selector device 24 alternatively the input signal $S_{IN}$ received on the first input 24a or the intermediate signal $S_C$ received on the second input 24b. The input signal $S_{IN}$ or intermediate signal $S_C$ outputted from the signal-selector device 24 is supplied at input to the signal-stabilization circuit 8, which in turn, through the buffer circuit 10, supplies it to the output port 11 of the communication cell 20.

Furthermore, the communication cell 20 may also be provided with ESD-protection diodes (not shown) coupled to the interface node 4, designed to absorb electrostatic discharge (ESD) energy that may be introduced from the interface node 4 and may causes malfunction and/or damage to the receiver 22 and/or the integrated circuit 7.

During use, when the control signal SEL has the first logic value (the receiver 22 is enabled), the output of the multiplexer device 24 is the intermediate signal $S_C$ supplied by the receiver 22 to the second input 24b of the multiplexer device 24; and when the communication cell 20 is working in contact mode, the control signal SEL has the second logic value (the receiver 22 is disabled), and the output of the multiplexer device 24 is the input signal $S_{IN}$ received by the multiplexer device at the first input 24a.

Figure 3:
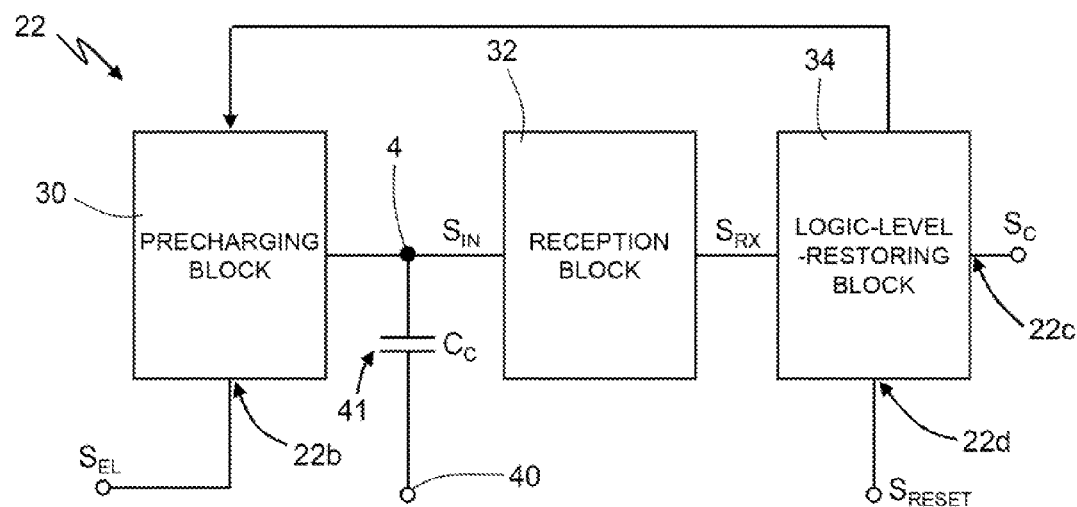
FIG. 3 shows a block diagram of an embodiment of a receiver device of the communication cell of FIG. 2.

FIG. 3 shows, by means of a block diagram, an embodiment of a receiver device 22 that may be used in the communication cell 20 of FIG. 2.

The receiver device 22 of FIG. 3 comprises a reception block 32, coupled to the interface node 4 and configured for receiving the input signal $S_{IN}$ and amplifying the data (digital values) carried by the input signal $S_{IN}$, outputting a received signal $S_{RX}$ correlated to the input signal $S_{IN}$ (in particular, signal $S_{RX}$ is the input signal $S_{IN}$ amplified); a precharge circuit 30, configured for biasing the reception block 32 in order to enable detection of the input signal $S_{IN}$ by the reception block 32, in the case where the input signal $S_{IN}$ is a digital signal with a swing not sufficient to be detected by the reception block 32; and, optionally, a restoring block 34, for restoring the logic level of the data generated by the reception block 32. Thus, the restoring block 34 restores the logic level of the signal $S_{RX}$, outputted by the reception block 32, by shaping the digital waveform thereof, for example rendering the rising and falling edges steeper. The restored signal outputted by the restoring block 34 is the intermediate signal $S_C$ generated at output 22c (see FIG. 2).

The precharge circuit 30 comprises the first control input 22b, which receives the control signal SEL, whilst the restoring block 34 comprises the second control input 22d, which receives the reset signal $S_{RESET}$. In case of absence of the restoring block 34, the signal $S_{RESET}$ may be provided to the reception block 32.

The restoring block 34 is moreover coupled to the precharge circuit 30, as described hereinafter.

The interface node 4 is coupled, according to the representation of FIG. 3, between the precharge circuit 30 and the reception block 32. The input capacitor, which, in use, is formed between the interface node 4 of the communication cell 20 (coinciding, as already said, with the pad) and a generic access device 40 (provided with a pad of its own) used for accessing the communication cell 20 by capacitive coupling, is referenced with reference number 41 and may have a value of coupling capacitance $C_C$ of a few femtofarads (fF).

Figure 4:
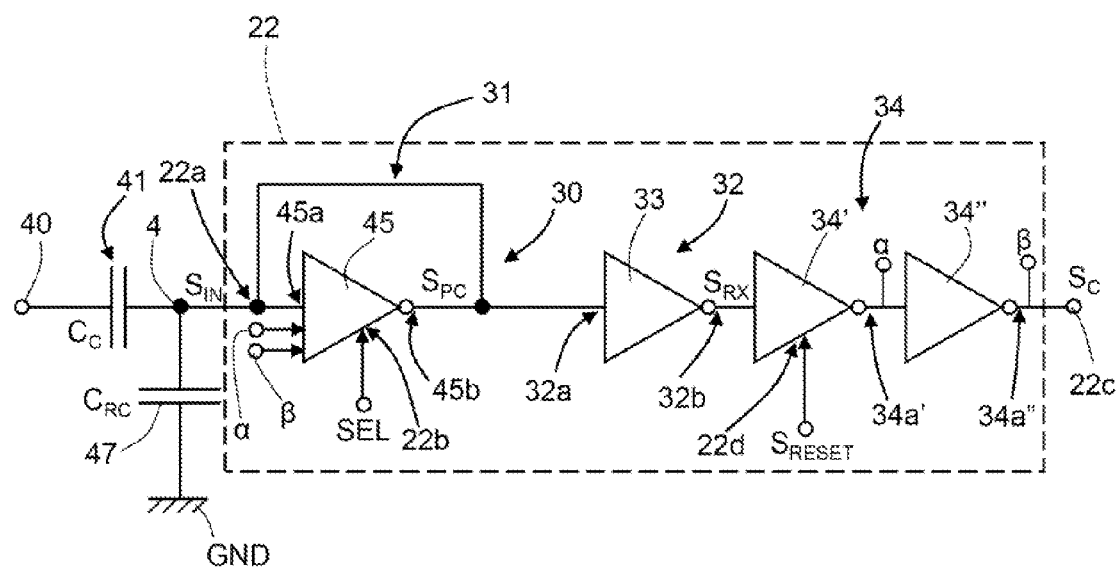
FIG. 4 shows a circuit diagram of an embodiment of the receiver device of FIG. 3.

FIG. 4 shows a circuit representation of an embodiment of the block diagram of FIG. 3. The precharge circuit 30 includes a precharge device 45, for example, an inverter of a CMOS type, configured for receiving at input 45a the input signal $S_{IN}$ and generating at output 45b a precharge signal $S_{PC}$. The precharge signal $S_{PC}$ is a direct current (DC) voltage signal.

The input 45a of the precharge device 45 is, in use, coupled to the input capacitor 41 and is coupled in parallel with a parasitic capacitor 47, having parasitic capacitance $C_{RC}$, which is formed between the interface node 4 and a ground reference terminal GND. In addition, the input 45a of the precharge device 45 is coupled to the output 45b of the precharge device 45 itself, in particular by means of a direct connection 31. The precharge device 45 further comprises the control input 22b, for receiving the control signal SEL designed to enable or inhibit operation of the precharge device 45. In the case of inhibition, the precharge device 45 behaves as an open circuit (i.e., it is off), and the interface node 4 is coupled to the reception block 32 exclusively by means of the direct connection 31, whereas, in the case of enabling, it resumes its operating state, and the interface node 4 is coupled to the reception block 32 by means of the precharge device 45 and the direct connection 31.

The reception block 32 comprises a threshold device 33, for example, an inverter of a CMOS type, configured for receiving at input 32a the precharge signal $S_{PC}$ and generating at output 32b the received signal $S_{RX}$. The reception block 32 generates at output the received signal $S_{RX}$ only when the signal that it receives in input exceeds a certain threshold, in particular the inversion threshold of the inverter 33.

The block 34 for restoring the signal logic level comprises one or more voltage-inverter devices (two inverter devices 34' and 34" are shown in figure) cascade coupled together. The inverter device 34' is coupled to the reception block 32 for receiving at input the signal $S_{RX}$ and generating at output 34a' a signal having an inverted logic value and rising and falling edges steeper than those of the received signal $S_{RX}$. The inverter device 34", having an input coupled to the output 34a' of the inverter device 34', operates in a similar way, and supplies at output 34a" a signal having an inverted logic value and rising and falling edges steeper than those of the signal generated at output from the inverter device 34'. In an embodiment two inverter devices 34', 34" are sufficient for obtaining a satisfactory restoration of the signal logic level. However, if necessary, it is possible to cascade together more than two inverter devices. The output of the inverter device 34" is the intermediate signal $S_C$ described with reference to FIG. 2.

The signals generated at output from the inverter device 34' and 34" are used for controlling operation of the reception block 32 (inputs referenced in figure by symbols α and β, taken at the outputs 34a' and 34a" of inverter devices 34' and 34"), as will be explained hereinafter with reference to FIGS. 6a and 6b.

The importance of the precharge circuit 30 in an embodiment is here explained with reference to FIG. 5.

Figure 5:
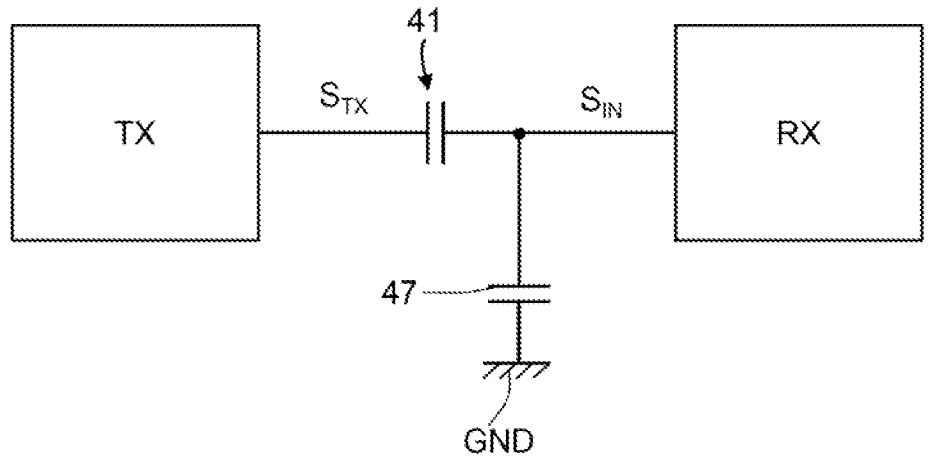
FIG. 5 shows, according to a schematic representation, an embodiment of a transmitter device and a receiver device, which are capacitively coupled to one another.

FIG. 5 shows a basic schematic regarding capacitive operation of an embodiment of a generic communication system, which comprises a transmitter TX (the generic access device 40) and a receiver RX (the receiver device 22) coupled by means of an input capacitor (the capacitor 41). In general, between the ground reference terminal GND and the outputs of the transmitter TX and of the receiver RX, respective parasitic capacitors are present (only parasitic capacitor 47 is shown in the figure). Consequently, the transmitter TX and the receiver RX are coupled by means of a mesh of capacitors comprising the input capacitor 41 and the parasitic capacitor 47. As is known, the capacitance value $C_{RC}$ of the parasitic capacitor 47 may not be determinable precisely beforehand. Consequently, assuming that the transmitter TX generates at output a signal $S_{TX}$, it may not be possible to determine precisely the input signal $S_{IN}$ that is received by the receiver RX. In particular, said signal $S_{IN}$ depends not only upon the signal $S_{TX}$, but also upon a capacitive divider H formed by the input capacitor 41 and by the parasitic capacitor 47. If $C_C$ and $C_{RC}$ are the values of capacitance of the input capacitor 41 and, respectively, of the parasitic capacitor 47, the capacitive divider H is given by $H=C_C/(C_C+C_{RC})$.

The input signal $S_{IN}$ is consequently given by $S_{TX} \cdot H$. Since the value of capacitance $C_{RC}$ is generally higher than the value of capacitance $C_C$ (for example, 150 times greater), the input signal $S_{IN}$ is a signal having a swing that is too low for the signal to be received and interpreted without ambiguity by the reception block 32.

Returning to FIG. 4, the precharge circuit 30 has hence the function of holding the voltage level at its output 45b (coupled to the input of the inverter 32) at a value such as to enable proper operation of the reception block 32.

Figure 6A:
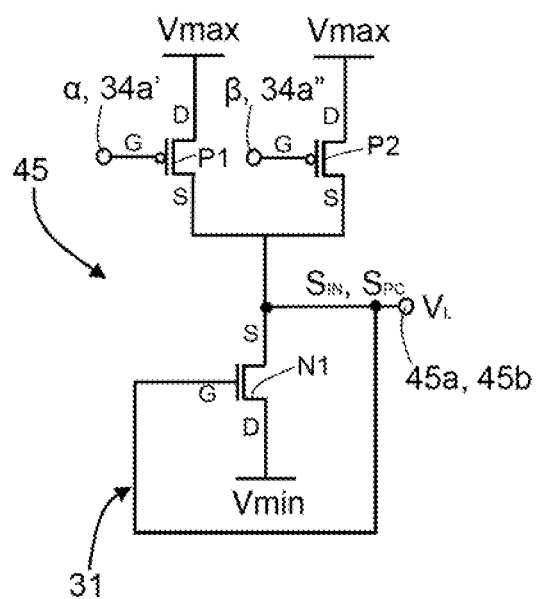
FIG. 6a shows an embodiment of an inverter that may be used in the receiver device of FIG. 4.
Figure 6B:
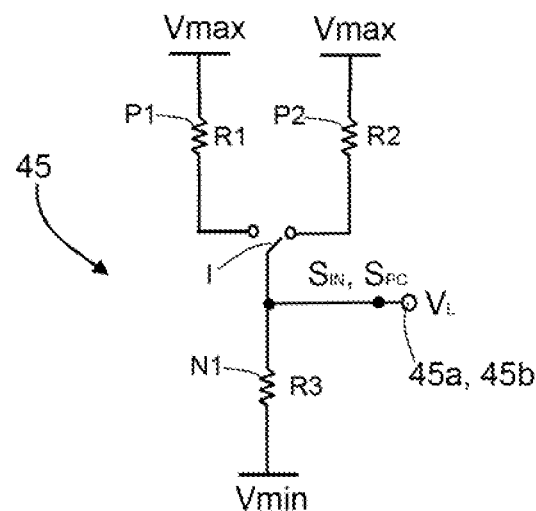
FIG. 6b shows, according to an equivalent circuit diagram, the inverter of FIG. 6a in use.

In particular, FIG. 6a shows an embodiment of an inverter 45 of a CMOS type, comprising a first branch including a first transistor P1 and a second transistor P2, of a PMOS type, coupled in parallel to one another and to a supply voltage Vmax through a respective drain terminal; and a second branch including a transistor N1, of an NMOS type, coupled to a supply voltage Vmin through an own drain terminal and coupled to the respective source terminals of the transistors P1 and P2 through an own source terminal. The transistor N1 further has the gate terminal coupled to the output 45b of the inverter 45, whilst the respective gate terminals of the transistors P1 and P2 are coupled, respectively, to the outputs 34a' and 34a" of the inverter devices 34' and 34" (shown in FIG. 4).

In use, since the signals at the outputs 34a' and 34a" have values opposite to one another, the transistors P1 and P2 are switched on and off in an alternating way. The switching on and off of the transistors P1 and P2 is schematically represented in FIG. 6b by means of a switch I. In addition, the transistors P1, P2 and N1 behave (FIG. 6b) as resistors each having a respective value of resistance R1, R2, and R3, forming a resistive divider and generating at output 45b a signal $S_{PC}$ having a voltage value $V_L$ equal to the mean value between the voltage Vmax that represents the high logic value "1" and the voltage Vmin that represents the low logic value "0". The value of equivalent resistance R1, R2 of the transistors P1 and P2 is chosen appropriately in such a way that the voltage value $V_L$ generated on the output 45b is approximately equal to the threshold voltage of the reception block 32. In greater detail, the value of equivalent resistance of the transistors P1 and P2 is chosen in such a way that, by switching the transistors P1 and P2 alternatively on or off, the signal $S_{PC}$ at output 45b from the inverter 45 assumes alternatively a value $V^+$ close, but greater than the threshold voltage of the reception block 32 or to a value $V^-$ close, but less than the threshold voltage of the reception block 32. The difference between $V^+$ and $V^-$ determines the sensitivity of the reception block 32 and may be chosen as a compromise between sensitivity and resistance to noise.

The inverter 45 supplies at output 45b a signal having the function of charging the input of the reception block 32 to voltage values such as to provide that the reception block 32 works in the proximity (or within) the high-gain status, thus obtaining a high sensitivity to the input signal $S_{IN}$. As an example, it is supposed that, during use, a logic value "0" has been received; the next expected datum is consequently a high logic value "1". It is hence convenient to proceed so that the reception block 32 is in an optimal condition for detecting the expected datum. For this reason, at a certain time instant, the input of the reception block 32 is charged at one of the two voltage values $V^+$ or $V^-$ according to the logic value of the datum received at the preceding time instant (and acquired, as has been said, from the outputs 34a' and 34a" of the inverter devices 34' and 34"). The choice of the two voltage values $V^+$ and $V^-$ with which to charge the input of the reception block 32 is linked to the sensitivity that it is desired to obtain.

Figure 6C:
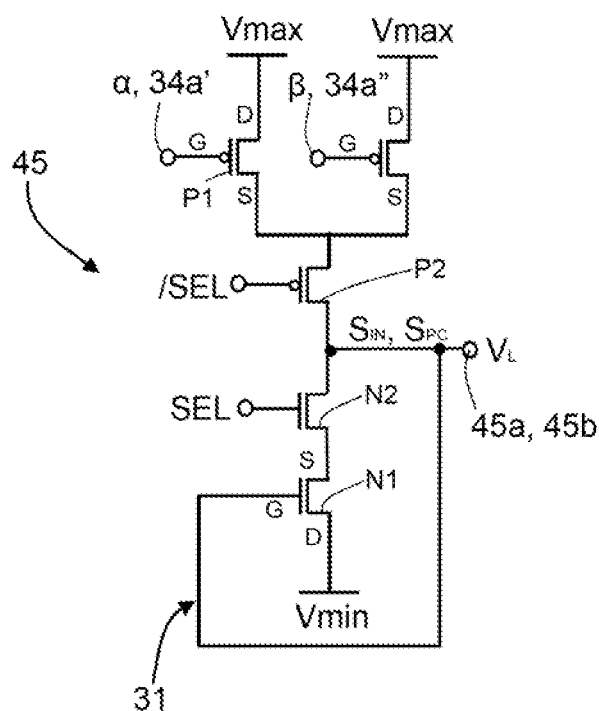
FIG. 6c shows an inverter that may be used in the receiver device of FIG. 4 according to a further embodiment.

The control signal SEL may act on the inverter 45 disabling the input 45a, for example using one or more switches (e.g., of a MOSFET type) coupled to the input 45a and configured for being switched, by the control signal SEL, on or off, and, if switched off, connecting the input 45a to a high-impedance. FIG. 6c shows an embodiment of the inverter 45 further including a switch P3 and a switch N2 driven by the control signal SEL so as to disable input 45a.

The digital value of the signal SEL may be set at a constant value during the design stage, or it may be varied during use by an operator, according to the application (contact or contactless operations)

With reference once again to FIG. 2, during use of the communication cell 20 in contactless mode, the input signal $S_{IN}$, received from the communication cell 20 via the interface node 4, is a digital voltage signal. The input signal $S_{IN}$ is supplied at input to the receiver device 22 and to the signal-selector device 24. The receiver device 22 operates as described previously and provides the intermediate signal $S_C$ at its output port 22d. The control signal SEL enables the precharge device 45 and, simultaneously, drives the signal-selector device 24 in such a way that it supplies at its output 24d the intermediate signal $S_C$ that it receives on the second input 24b. Hence, the communication cell 20 operates according to its own standard operating characteristics as discussed above.

If, alternatively, the communication cell 20 is used in contact mode, the control signal SEL switches the precharge device 45 off and, simultaneously, drives the signal-selector device 24 in such a way that it supplies at its output 24c the input signal $S_{IN}$ that it receives on the second input 24b.

Hence, also in this case, the communication cell 20 operates according to its own standard operating characteristics as discussed above.

In an embodiment, use of the communication cell 20 in output mode does not require modifications with respect to the conventional communication cell 1 of FIG. 1.

Figure 7:
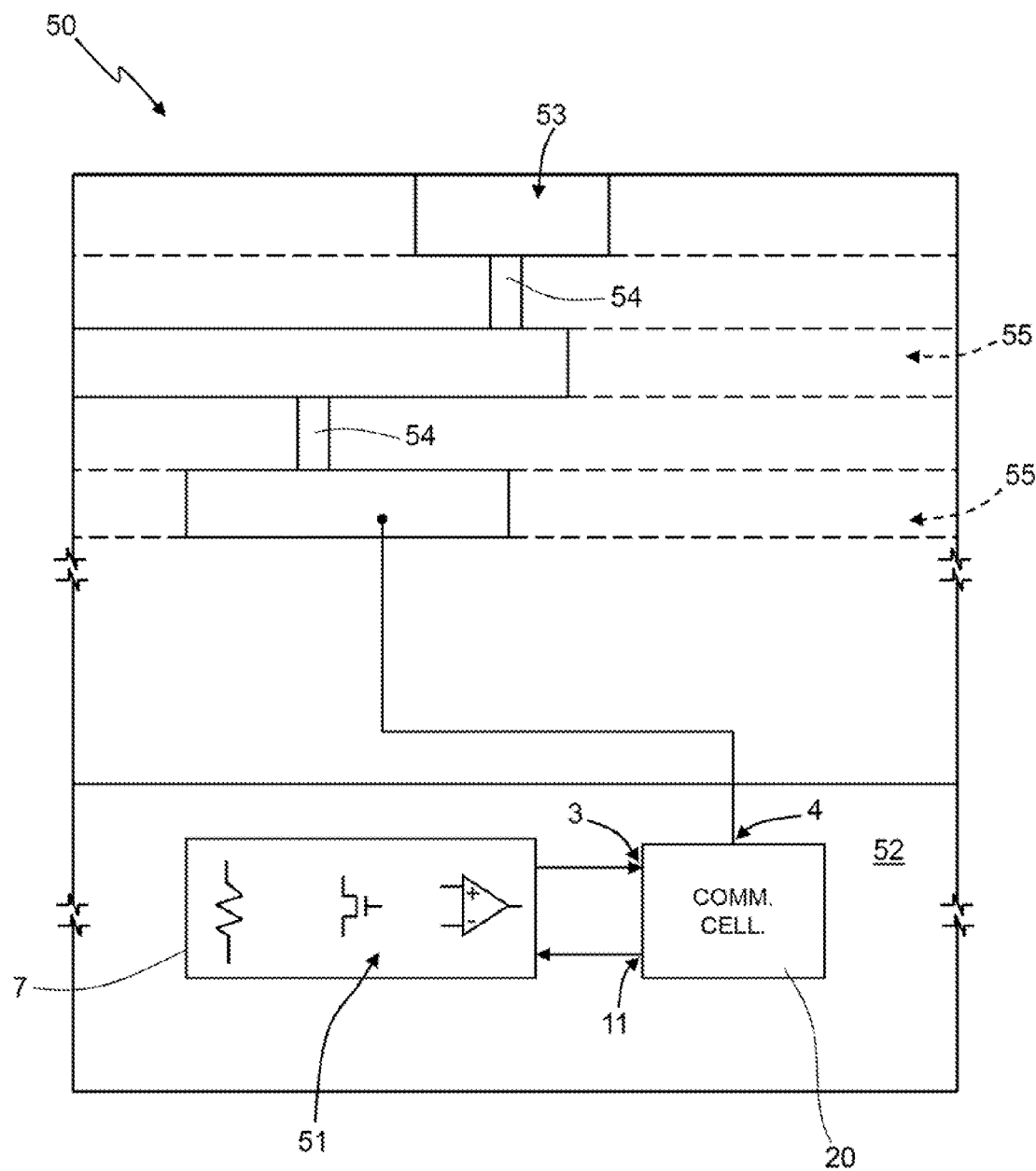
FIG. 7 shows, schematically, a cross section of an embodiment of a die comprising the communication cell of FIG. 2.

FIG. 7 shows, schematically, a cross section of a die 50 comprising electronic components 51, integrated in a substrate 52, for example forming the integrated circuit 7, according to an embodiment. The electronic components may be formed in a known way. Integrated in the substrate 52 is also formed the communication cell 20 previously described.

The upper metal layer of die 50 includes a contact pad unit 53, electrically coupled to the interface node 4 of the communication cell 20. The contact pad unit 53 is, according to an embodiment of the present disclosure, a pad made of a conductive material, typically metal, such as aluminum. The contact pad unit 53 is electrically coupled to the communication cell 20 through a plurality of conductive vias 54 and, possibly, further metal layers (referenced as layers 55). It is evident that the layers 55 are not necessary, and the contact pad unit 53 may be directly coupled to the communication cell 20. Moreover, electronic components 51 and/or the communication cell 20 may be formed, at least partially, above the substrate 52, within the metal layers 55.

The communication cell 20 of FIG. 7 acts as an interface for allowing communication between an external electronic unit (not shown), capacitively or ohmically coupled to the contact pad unit 53, and the integrated circuit 7.

Figure 8:
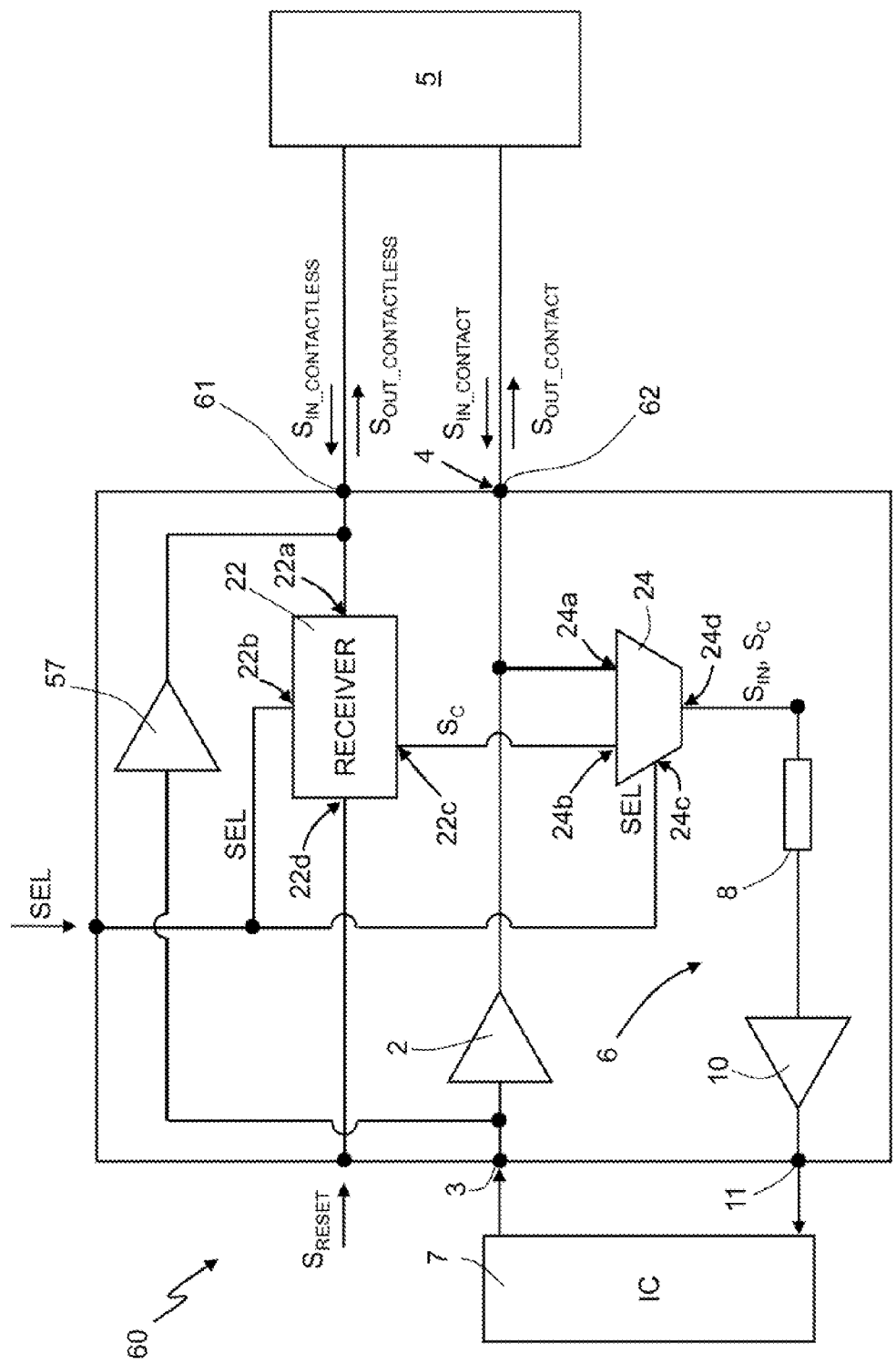
FIG. 8 shows a circuit diagram of a communication cell according to a further embodiment.

FIG. 8 shows a communication cell 60 according to a further embodiment of the present disclosure.

The communication cell 60 is analogous to the communication cell 20 of FIG. 2 (common elements of communication cell 20 and 60 are not further described and are referenced using the same reference numbers). Communication cell 60 includes two external interface nodes 61 and 62, replacing the interface node 4 shown in FIG. 2.

The external interface node 61 is coupled to the input port 22a of the receiver device 22 and forms and input/output node of the communication cell 60 during contactless operation mode. The signal (signal $S_{IN\_CONTACTLESS}$ in FIG. 8) received by the external interface node 61 through capacitive coupling is provided to the input port 22a of the receiver device 22, to be processed as already described with reference to the communication cell 20.

The communication cell 60 further comprises a transmitter 57 which is, for example, a common digital buffer. The transmitter 57 is coupled between the input port 3 of the communication cell 60 and the external interface node 61, and is configured to receive a signal coming from the integrated device 7 and providing that signal to the external interface node 61 (signal $S_{OUT\_CONTACTLESS}$ in FIG. 8).

The functioning of the communication cell 60 during contactless operation mode may be the same as previously described with reference to communication cell 20.

The external interface node 62 is physically separated and/or electrically isolated from the external interface node 61 and is coupled to the first input 24a of the multiplexer device 24. The external interface node 62 forms an input/output node of the communication cell 60 during contact mode of operation, to receive a input signal $S_{IN\_CONTACT}$ and output an output signal $S_{OUT\_CONTACT}$ The functioning of the communication cell 60 during contact mode may be as previously described with reference to communication cell 20.

The electronic system 5 may access to the communication cell 60 through the external interface node 61 (i.e., through capacitive coupling) or through the external interface node 62 (i.e., through ohmic contact).

Figure 9:
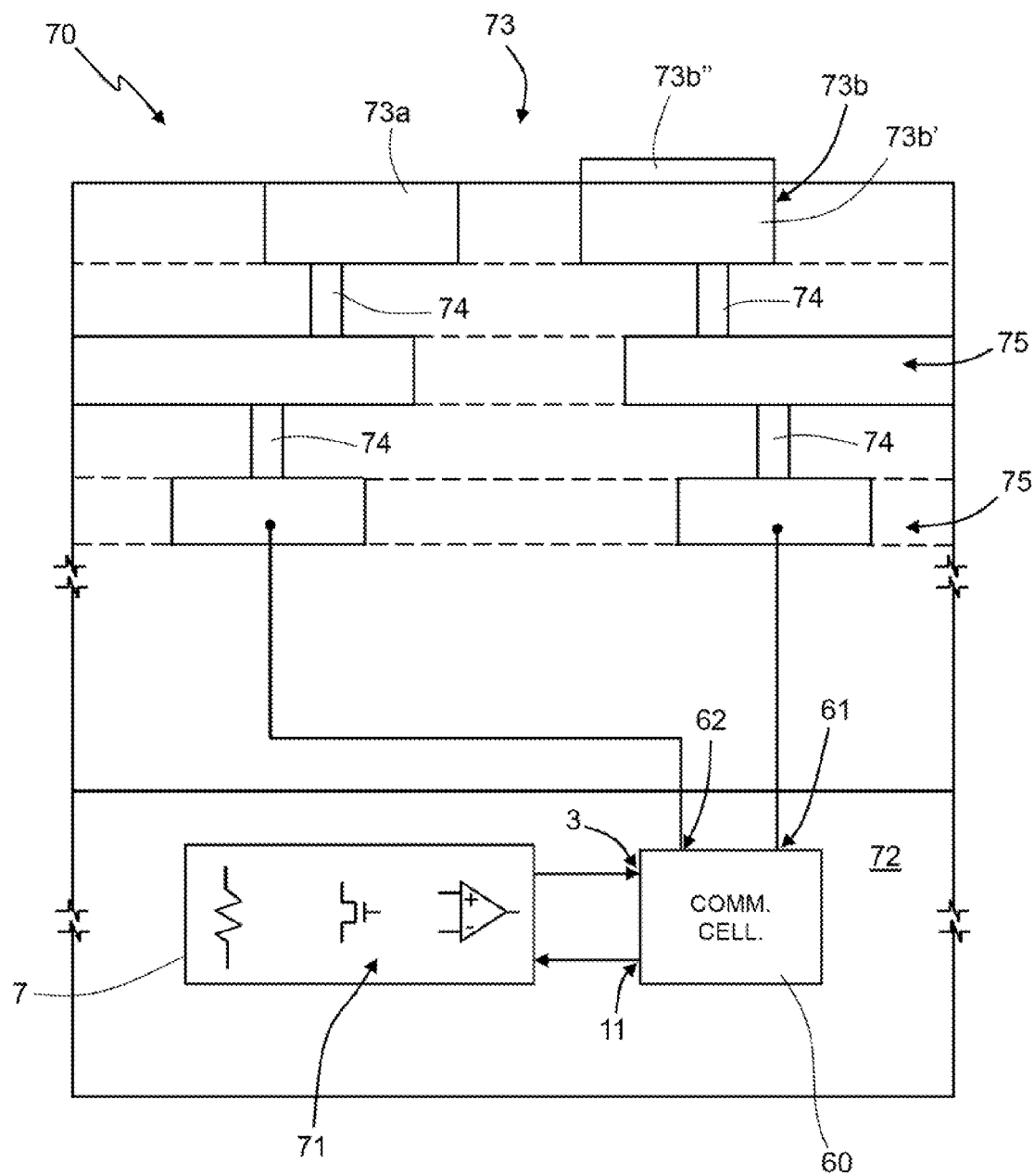
FIG. 9 shows, schematically, a cross section of an embodiment of a die comprising the communication cell of FIG. 8.

FIG. 9 shows, schematically, a cross section of a die 70 comprising the communication cell 60 of FIG. 8 according to an embodiment. The die 70 comprises electronic components 71 integrated in a substrate 72, for example forming the integrated circuit 7. Integrated in the substrate 72 is also formed the communication cell 60. The electronic components 71 are formed in a known way using standard techniques.

The upper metal layer of die 70 includes a contact pad unit 73, electrically coupled to the external interface nodes 61 and 62 of the communication cell 60. The contact pad unit 73 includes, according to an embodiment of the present disclosure, two pads 73a, 73b of a conductive material, typically metal, such as aluminum. The contact pad unit 73 is electrically coupled to the communication cell 60 through a plurality of conductive vias 74 and, possibly, further metal layers (referenced as layers 75). It is evident that the layers 75 are not necessary, and the contact pad unit 73 may be directly coupled to the communication cell 60. Moreover, electronic components 71 and/or the communication cell 60 may be formed, at least partially, above the substrate 72, within the metal layers 75.

More in particular, with reference to FIGS. 8 and 9, the pad 73a is configured to be used in contact mode, and is thus coupled to the input port 22a of the receiver device 22, while the pad 73b is configured to be used in contactless mode, and is thus coupled to the first input 24a of the multiplexer device 24 of communication cell 60.

In use, the communication cell 60 of FIG. 9 acts as an interface for allowing communication between an external electronic unit (not shown), capacitively coupled to the pad 73b or ohmically coupled to the pad 73a, and the integrated circuit 7.

According to an embodiment of the present disclosure, pad 73b comprises a conductive portion 73b', for example made of aluminum, and a dielectric portion 73b", of a passivation layer formed over and in contact with the conductive portion 73b'. The dielectric portion 73b" may have a thickness ranging from a fraction of micrometers to some micrometers. During contactless operation mode, a probe may be set indifferently at a distance from or in direct contact with the dielectric portion 73b" of pad 73b, achieving capacitive coupling with the underlying conductive portion 73b'. The passivation layer interposed between the probe and the conductive portion 73b' has the function of dielectric interposed between opposite faces of a capacitor, and provides a dielectric constant even higher than that or air. Furthermore, the dielectric portion 73b" prevents the conductive portion 73b' from being scratched or damaged during use.

Pad 73a, being configured for contact operation mode, is free from a dielectric portion, and only comprises a conductive portion.

During use in contact mode, for example for the purpose of testing the integrated circuit 7, a contact probe may be set in direct contact with pad 73a; during use in contactless (or capacitive) mode, probe-pad coupling is achieved by setting a probe proximate to or in contact with the dielectric portion 73b" of pad 73b.

Communication cell 20 described with reference to FIGS. 2-5 finds an application in electronic systems of an integrated type that are tested for evaluating proper operation thereof. Electronic systems that comprise a plurality of communication cells 20 may interface with test probes irrespective of whether they are of contact or contactless type, according to the particular application and/or the instrumentation available for carrying out the test.

Figure 10:
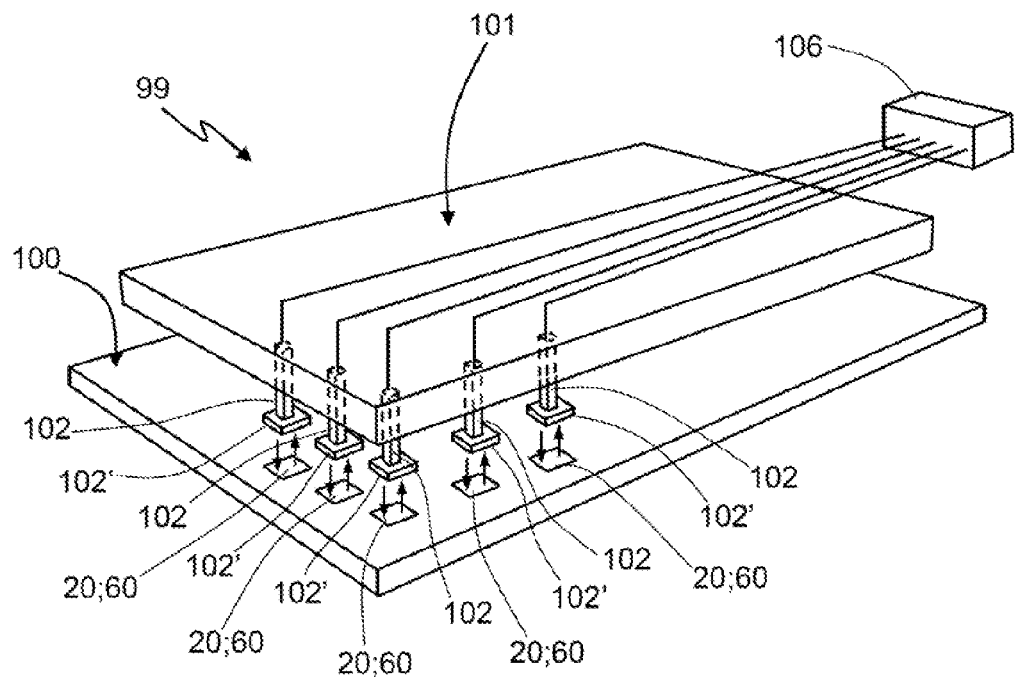
FIG. 10 shows an embodiment of a testing device for an integrated circuit comprising a plurality of communication cells of FIG. 2 and/or FIG. 8.

FIG. 10 shows an embodiment of a testing system 99 (i.e., the aforementioned electronic system 5) for testing a device under test 100 (i.e., the aforementioned integrated circuit 7). The testing system 99 comprises a probe card 101, which includes a plurality of probes 102 configured for operating in wireless mode. In particular, the probe card 101 comprises a plurality of probes 102 configured for capacitively coupling with a respective plurality of communication cells 20 belonging to the device under test 100. Alternatively, the probes 102 may be configured for coupling with a respective communication cell 20 either in contact mode or in contactless mode. In the latter case, for example, each probe 102 comprises a terminal portion 102', which is designed to contact the pad of the communication cell 20 but acts, if arranged at a distance from the pad of the communication cell 20, as a plate of the capacitor 41.

Each probe 102 may comprise a communication cell 20 of the type described with reference to FIG. 2 in order to be able to communicate in data transmission and reception with a communication cell 20 of the device under test 100 by capacitive or ohmic coupling means (direct electrical connection).

Each probe 102 is moreover coupled to a test station 106, from which it receives test signals for the device under test 100 and to which it sends response signals of the device under test 100 to the test signals to be analyzed.

Figure 11:
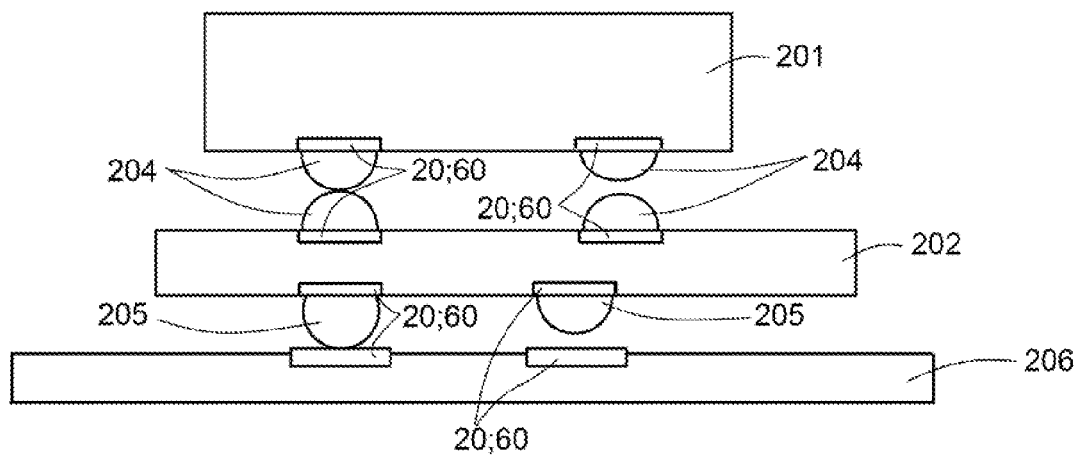
FIG. 11 shows a plurality of chips and a substrate coupled to one another and presenting ohmic-contact failure according to an embodiment.

Finally, FIG. 11 shows another application of communication cells 20 according to FIG. 2 and/or communication cell 60 according to FIG. 8.

In an embodiment, electrical connections of an ohmic type are made between a plurality of chips and between chips and a substrate. Said connections envisage the provision of conductor elements, having a thickness, which extend from respective portions of chips and portions of the substrate. During an integration step, said electrical connections may be arranged facing one another and in direct electrical contact with one another. However, on account of the process spread, it may happen that the thickness of said conductor elements is non-uniform and/or, following upon the integration step of the chips and the substrate, the conductor elements are not perfectly aligned with respective conductor elements of other chips and/or of the substrate with which they must make a connection. In either case, the electrical connection may not be achieved.

FIG. 11 shows, according to an embodiment of the present disclosure, a first chip 201 coupled to a second chip 202 through a plurality of electrical-connection elements 204 (for example, bumps, stubs, through-silicon vias, etc.). The second chip 202 is then coupled to a substrate 206 via a respective plurality of electrical-connection elements 205. In addition, each electrical-connection element 204, 205 is interfaced with the respective chip 201, 202 and with the substrate 206 via a communication cell 20 of the type described with reference to FIG. 2, or communication cell 60 according to FIG. 8. In this way, if, on account of the spreads of the fabrication process or of oxidation, one or more electrical-connection elements 204, 205 were not to have adequate thickness to enable an ohmic connection with the respective electrical-connection element 204, 205 that they face (see, for example, in FIG. 11, the electrical-connection elements 204, 205 to the right), the communication in transmission and reception is in any case provided in contactless mode by capacitive coupling according to what has already been described with reference to the communication cell 20.

In this way, it is evident that the reliability and the production yield may be considerably increased.

Figure 12:
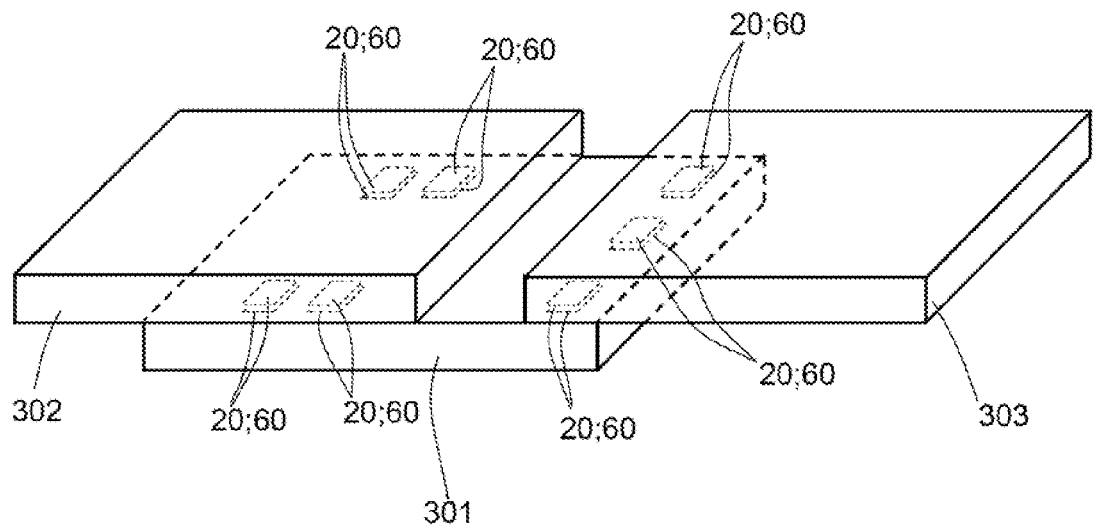
FIG. 12 shows a plurality of chips comprising a respective plurality of communication cells of FIG. 2 and/or FIG. 8 coupled to one another by means of said communication cells enabling a 3D integration of said chips according to an embodiment.

Finally, as shown in FIG. 12, a communication cell 20 of the type described with reference to FIGS. 2-5 finds a further application in the 3D integration of chips. For example, FIG. 12 shows a first chip 301, a second chip 302, and a third chip 303, capacitively coupled to one another by means of a plurality of communication cells 20 (and/or communication cells 60) of an input/output type, which are equipped with a capacitive-coupling interface (the pad) configured for sending and receiving digital signals. The communication cells 20, 60 of the chips 301, 302, and 303 may indifferently be test communication cells or communication cells having other purposes, configured for enabling data communication between chips different from one another ("intra-chip" communication). In this way, the need to use physical connections, for example bumps, stubs, or TSVs (through-silicon vias) is overcome, thus rendering the 3D integration of chips particularly compact.

In addition, the embodiment of FIG. 12 enables access to test communication cells 20 even after the 3D integration and/or packaging step. In fact, it may be possible to stimulate with input signals the single chip 302 and collect respective response signals from the single chip 303, analyzing also the behavior of the chip 301, not directly stimulated.

Figure 13:
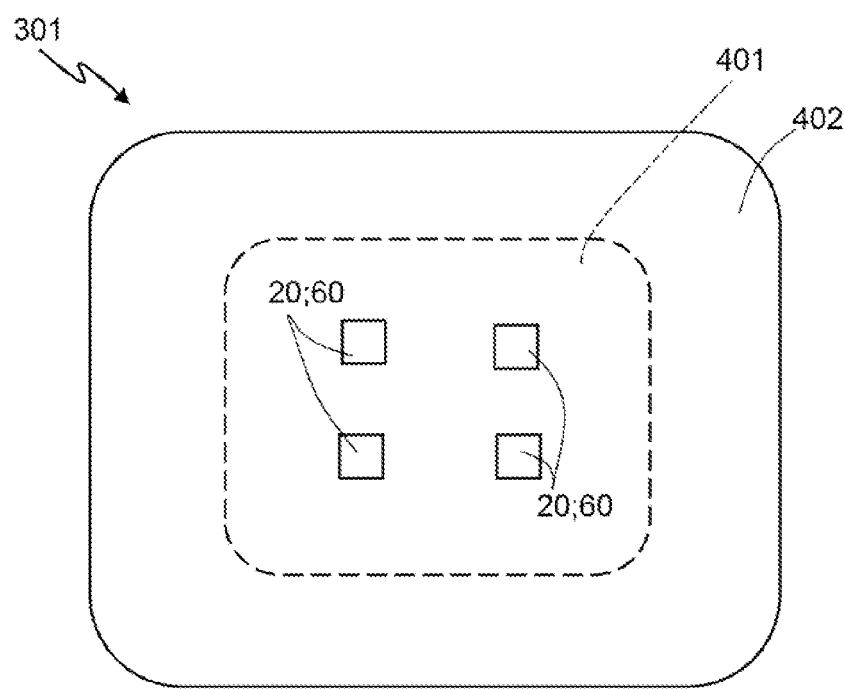
FIG. 13 shows, in top plan view, a chip comprising a plurality of communication cells arranged in a central portion of said chip according to an embodiment.

In addition, as shown in FIG. 13, test communication cells 20, 60 may be arranged in any area of the chips 301-303. For example, the chip 301 (but it applies to all the chips 301-303) comprises a central portion 401 surrounded by a peripheral portion 402. In particular, one or more of the communication cells 20, 60 may be arranged within the central portion 401, and may be easily accessible by means of capacitive connection. This may prove particularly advantageous in chips or integrated circuits of a "pad-limited" type, wherein the number of communication cells 20, 60 that may be provided in the peripheral portion 402 of the chip 301 is limited.

From an examination of the characteristics of one or more embodiments of the present disclosure advantages thereof are evident.

In particular, communication cells 20, 60 according to an embodiment of the present disclosure enable access to generic integrated circuits indifferently with or without the aid of probes of a mechanical type that operate in direct electrical contact. In addition, they enable intra-chip communication and 3D integration of chips in a way that is economically advantageous, compact, and without requiring electrical wire connections. Furthermore, transfer of data between communication cells is possible also at a high frequency in wireless operation, rendering communication possible, for example, between different chips, at a high speed.

In an embodiment, the integration of a receiver device 22 and of a signal-selector device 24 as described with reference to FIG. 2 in a communication cell of a known type (for example, of the type shown in FIG. 1) does not require significant modifications to the existing structure of the communication cell of a known type, thus rendering integration economically advantageous.

Furthermore, the communication cell according to an embodiment of the present disclosure enables reception and/or sending of data both in digital mode and in analog mode. In particular, in the case of contactless operating mode sending and reception of data occur in digital mode, whereas in the case of contact operating mode sending and reception of data occur in analog mode.

In addition, the technology of miniaturization of the pads may not follow the same trend of scaling-down as that of integrated circuits. This could be the cause of a considerable waste of area for each chip. The fact that the dimensions of the pads may not be reduced with the same trend as the integrated circuits is caused by the need to contact said pads in direct-contact mode (via probes or with wires). The use of communication cells 20 of the type described, which operate in contactless mode, enables pads to be obtained of dimensions of as little as 6 μm, overcoming the drawbacks of waste of area.

A further advantage of an embodiment lies in the possibility of eliminating, or at least reducing, the presence of devices for protection against electrostatic discharge, which are usually coupled to communication cells of a known type. Said devices are particularly useful for limiting the damage due to electrostatic discharge that is generated following upon direct contact between, for example, a contact probe and a pad of a communication cell. The use of communication cells according to an embodiment of the present disclosure, when it is performed in contactless mode, eliminates said drawback.

With reference to the embodiment of FIG. 8, one advantage lies in the fact that, thanks to the presence of the dielectric portion 73b'' (FIG. 2), damages to the receiver 22 due to an electrostatic discharge (that may be introduced by an accidental physical contact between a, for example, test probe and the pad 73b) are prevented without the need for ESD-protection diodes.

According to the embodiment of FIG. 8, another advantage lies in the fact that an accidental physical contact between a test probe and the pad 73b does not cause scratching of the conductive portion 73b' of the pad 73.

Finally, modifications and variations may be made to the present disclosure, as described and illustrated herein, without thereby departing from the scope of the present disclosure.

For example, the inverter 45 that has its own input coupled to its own output may be replaced by a resistive divider.

In addition, the signal-selector device 24, as likewise the control signal SEL, are not necessary for mere operation of the communication cell 20, 60 according to the present disclosure, provided that the receiver 22 is in its enabled ("on") state. With reference to the communication cell 20, even during operation in contact mode, the receiver device 22 is able to receive and interpret correctly any input signal $V_{IN}$ of a digital type supplied at its input 22a. In this case, however, operation of the communication cell 20 may be non-optimal in so far as the current consumption may be high and the levels of performance may be degraded. With reference to communication cell 60, since the input nodes 61, 62 for contact and contactless coupling are physically separated, the control signal SEL is not necessary to disable the receiver 22 or control the functioning of MUX 24.

In addition, it is clear that the communication cell described may comprise an input circuit 6 and a load-driving circuit 2 of a different type from what has been shown and described. In particular, since an embodiment of the receiver device 22 requires less space and may not require additional modifications to the circuits of communication cells of a known type, it may be implemented in any communication cell of a known type.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A circuit, comprising:
   a circuit output node;
   a first stage configured to receive a non-capacitively coupled first signal, and to couple the first signal to the output node; and
   a second stage configured to receive a capacitively coupled second signal, and to couple the second signal to the output node;
   wherein the second stage comprises:
   a precharger having an input node configured to receive the capacitively coupled second signal and having a feedback node; and
   a signal level restorer having an input node coupled to the input node of the precharger, having an output node coupled to the circuit output node, and having a feedback node coupled to the feedback node of the precharger.

2. A circuit, comprising:
   a circuit output node;
   a first stage configured to receive a non-capacitively coupled first signal, and to couple the first signal to the output node; and
   a second stage configured to receive a capacitively coupled second signal, and to couple the second signal to the output node;
   a circuit input node configured to receive the first signal and the capacitively coupled second signal;
   wherein the first and second stages each include a common stage that includes an inverter having an input node coupled to the circuit input node and having an output node coupled to the inverter input node, the common stage configured as the first stage while the inverter is disabled, and the common stage configured as the second stage while the inverter is enabled.

3. The circuit of claim 2 wherein the first stage comprises a conductor coupled between the input node and the output node.

4. The circuit of claim 2 wherein the second stage comprises:
   a precharger configured to receive the capacitively coupled second signal; and
   at least one buffer coupled between the precharger and the circuit output node.

5. The circuit of claim 2 wherein the second stage comprises:
   a first inverter having an input node configured to receive the capacitively coupled second signal, a feedback node, and an output node coupled to the input node;
   a second inverter having an input node coupled to the output node of the first inverter and having an output node coupled to the circuit output node and to the feedback node of the first inverter.

6. The circuit of claim 2 wherein the second stage comprises:
   a supply node;
   a first inverter having an input node configured to receive the capacitively coupled second signal, a feedback node, and an output node coupled to the input node;
   a parasitic capacitor having a first node coupled to the input node of the first inverter and having a second node coupled to the supply node; and
   a second inverter having an input node coupled to the output node of the first inverter and having an output node coupled to the circuit output node and to the feedback node of the first inverter.

7. The circuit of claim 2 wherein the second stage comprises:
   a first inverter having an input node configured to receive the capacitively coupled second signal, a feedback node, and an output node coupled to the input node;
   a second inverter having an input node coupled to the output node of the first inverter and having an output node coupled to the feedback node of the first inverter; and
   a third inverter having an input node coupled to the output node of the second inverter and having an output node coupled to the circuit output node.

8. The circuit of claim 2 wherein the second stage comprises:
   a first inverter having an input node configured to receive the capacitively coupled second signal, first and second feedback nodes, and an output node coupled to the input node;
   a second inverter having an input node coupled to the output node of the first inverter and having an output node coupled to the first feedback node of the first inverter; and
   a third inverter having an input node coupled to the output node of the second inverter and having an output node coupled to the circuit output node and to the second feedback node of the first inverter.

9. The circuit of claim 2 wherein the second stage comprises:
   a first inverter having an input node configured to receive the capacitively coupled second signal, first and second feedback nodes, and an output node coupled to the input node;
   a second inverter having an input node coupled to the output node of the first inverter and having an output node;
   a third inverter having an input node coupled to the output node of the second inverter and having an output node coupled to the first feedback node of the first inverter; and
   a fourth inverter having an input node coupled to the output node of the third inverter and having an output node coupled to the circuit output node and to the second feedback node of the first inverter.

10. The circuit of claim 2 wherein the second stage comprises:
    a first inverter having an input node configured to receive the capacitively coupled second signal, first and second feedback nodes, and an output node coupled to the input node, the first inverter comprising:
    first and second supply nodes;
    a first switch having a control node coupled to the first feedback node, a first conduction node coupled to the first supply node, and a second conduction node;
    a second switch having a control node coupled to the second feedback node, a first conduction node coupled to the first supply node, and a second conduction node; and
    a third switch having a control node coupled to the output node, a first conduction node coupled to the second conduction nodes of the first and second switches, and a third conduction node coupled to the second supply node;
    a second inverter having an input node coupled to the output node of the first inverter and having an output node coupled to the first feedback node of the first inverter; and
    a third inverter having an input node coupled to the output node of the second inverter and having an output node coupled to the circuit output node and to the second feedback node of the first inverter.

11. The circuit of claim 2 wherein the second stage comprises:
- a first inverter having an input node configured to receive the capacitively coupled second signal, first and second feedback nodes, and an output node coupled to the input node, the first inverter comprising:
- first and second supply nodes;
- a first switch having a control node coupled to the first feedback node, a first conduction node coupled to the first supply node, and a second conduction node;
- a second switch having a control node coupled to the second feedback node, a first conduction node coupled to the first supply node, and a second conduction node;
- a third switch having a control node coupled to the output node, a first conduction node coupled to the second conduction nodes of the first and second switches, and a third conduction node coupled to the second supply node; and
- a fourth switch coupled between the first conduction node of the third switch and the second conduction nodes of the first and second switches and having a control node configured to receive an enable signal;
- a second inverter having an input node coupled to the output node of the first inverter and having an output node coupled to the first feedback node of the first inverter; and
- a third inverter having an input node coupled to the output node of the second inverter and having an output node coupled to the circuit output node and to the second feedback node of the first inverter.

12. The circuit of claim 2 wherein the second stage comprises:
- a first inverter having an input node configured to receive the capacitively coupled second signal, first and second feedback nodes, and an output node coupled to the input node, the first inverter comprising:
- first and second supply nodes;
- a first transistor having a control node coupled to the first feedback node, a first conduction node coupled to the first supply node, and a second conduction node;
- a second transistor having a control node coupled to the second feedback node, a first conduction node coupled to the first supply node, and a second conduction node; and
- a third transistor having a control node coupled to the output node, a first conduction node coupled to the second conduction nodes of the first and second switches, and a third conduction node coupled to the second supply node;
- a second inverter having an input node coupled to the output node of the first inverter and having an output node coupled to the first feedback node of the first inverter; and
- a third inverter having an input node coupled to the output node of the second inverter and having an output node coupled to the circuit output node and to the second feedback node of the first inverter.

13. The circuit of claim 2 wherein the second stage comprises:
- a first inverter having an input node configured to receive the capacitively coupled second signal, first and second feedback nodes, and an output node coupled to the input node, the first inverter comprising:
- first and second supply nodes;
- a first transistor having a control node coupled to the first feedback node, a first conduction node coupled to the first supply node, a second conduction node, and a first on impedance;
- a second transistor having a control node coupled to the second feedback node, a first conduction node coupled to the first supply node, a second conduction node, and a second on impedance that is different that the first on impedance; and
- a third transistor having a control node coupled to the output node, a first conduction node coupled to the second conduction nodes of the first and second switches, and a third conduction node coupled to the second supply node;
- a second inverter having an input node coupled to the output node of the first inverter and having an output node coupled to the first feedback node of the first inverter; and
- a third inverter having an input node coupled to the output node of the second inverter and having an output node coupled to the circuit output node and to the second feedback node of the first inverter.

14. The circuit of claim 2, further comprising:
- a circuit input node configured to receive the first and second signals;
- wherein the first stage is coupled to the circuit input node; and
- wherein the second stage is coupled to the circuit input node.

15. The circuit of claim 2, further comprising:
- a first circuit input node configured to receive the first signal;
- a second circuit input node configured to receive the second signal;
- wherein the first stage is coupled to the first circuit input node; and
- wherein the second stage is coupled to the second circuit input node.

16. The circuit of claim 2, further comprising:
- wherein the first stage has a first output node;
- wherein the second stage has a second output node; and
- a multiplexer having a first input node coupled to the first output node, a second input node coupled to the second output node, and an multiplexer output node coupled to the circuit output node.

17. The circuit of claim 2, further comprising:
- wherein the first and second stages have respective first and second input nodes;
- a circuit input/output node configured to receive the first and second signals and coupled to the first and second input nodes of the first and second stages; and
- a buffer having an input node coupled to the circuit input node and having an output node coupled to the circuit input/output node.

18. The circuit of claim 2, further comprising:
- wherein the first and second stages have respective first and second input nodes;
- first and second circuit input/output nodes configured to receive the first and second signals, respectively, and respectively coupled to the first and second input nodes of the first and second stages; and
- a buffer having an input node coupled to the circuit input node and having an output node coupled to the first and second circuit input/output nodes.

19. The circuit of claim 2, further comprising:
wherein the first and second stages have respective first and second input nodes;
first and second circuit input/output nodes configured to receive the first and second signals, respectively, and respectively coupled to the first and second input nodes of the first and second stages; and
first and second buffers having respectively first and second buffer input nodes coupled to the circuit input node and having first and second buffer output nodes respectively coupled to the first and second circuit input/output nodes.

20. A circuit, comprising:
a circuit output node;
a first stage configured to receive a non-capacitively coupled first signal, and to couple the first signal to the output node; and
a second stage configured to receive a capacitively coupled second signal, and to couple the second signal to the output node;
wherein the second stage comprises:
a precharger having an input node configured to receive the capacitively coupled second signal and having a feedback node; and
a signal level restorer having an input node coupled to the input node of the precharger and having an output node coupled to the circuit output node and to the feedback node of the precharger.

21. A circuit, comprising:
a circuit output node;
a first stage configured to receive a non-capacitively coupled first signal, and to couple the first signal to the output node; and
a second stage configured to receive a capacitively coupled second signal, and to couple the second signal to the output node;
wherein the second stage comprises:
a precharger having an input node configured to receive the capacitively coupled second signal, a feedback node, and an output node coupled to the input node; and
a buffer having an input node coupled to the output node of the precharger and having an output node coupled to the circuit output node and to the feedback node of the precharger.

22. A circuit, comprising:
a circuit output node;
a first stage configured to receive a non-capacitively coupled first signal, and to couple the first signal to the output node; and
a second stage configured to receive a capacitively coupled second signal, and to couple the second signal to the output node;
the circuit further comprising:
a circuit input node configured to receive the first signal and the capacitively coupled second signal;
wherein the first and second stages each include a common stage that includes an inverter having an input node coupled to the circuit input node and having an output node coupled to the inverter input node, the common stage configured to receive the non capacitively coupled first signal and to couple the first signal to the output node while the inverter is disabled, and the common stage configured to receive the capacitively coupled second signal and to couple the second signal to the output node while the inverter is enabled.

23. An integrated circuit, comprising:
a first conductive pad configured to receive a non capacitively coupled first signal;
circuitry having a circuitry input node;
a first stage having a first input node coupled to the conductive pad and configured to couple the first signal to the circuitry input node;
a second stage having a second input node configured to receive a capacitively coupled second signal through a capacitive element such that a first node of the capacitive element is coupled to the second stage and a second node of the capacitive element is coupled to receive the second signal, the second stage configured to couple the second signal to the circuitry input node;
first and second circuit input/output nodes configured to receive the first and second signals, respectively, and respectively coupled to the first and second input nodes of the first and second stapes; and
a buffer having an input node coupled to the circuitry input node and having an output node coupled to the first and second circuit input/output nodes.

24. The integrated circuit of claim 23 wherein the conductive pad is configured to receive the capacitively coupled second signal and is coupled to the second input node of the second stage.

25. The integrated circuit of claim 23, further comprising a second conductive pad that is configured to receive the capacitively coupled second signal and is coupled to the second input node of the second stage.

26. The integrated circuit of claim 23, further comprising:
a second conductive pad that is configured to receive the capacitively coupled second signal and is coupled to the second input node of the second stage; and
an insulator disposed over at least a portion of the second conductive pad.

27. The integrated circuit of claim 23, further comprising:
wherein the circuitry has a circuitry output node; and
a third stage having a third input node coupled to the circuitry output node and configured to couple a third signal from the circuitry output node to the first conductive pad.

28. The integrated circuit of claim 23, further comprising:
a second conductive pad that is configured to receive the capacitively coupled second signal and is coupled to the second input node of the second stage;
an insulator disposed over at least a portion of the second conductive pad:
wherein the circuitry has a circuitry output node; and
a third stage having a third input node coupled to the circuitry output node and configured to couple a third signal from the circuitry output node to the first and second conductive pads.

29. An integrated circuit, comprising:
a first conductive pad configured to receive a non capacitively coupled first signal;
circuitry having a circuitry input node;
a first stage having a first input node coupled to the conductive pad and configured to couple the first signal to the circuitry input node;
a second stage having a second input node configured to receive a capacitively coupled second signal, the second stage configured to couple the second signal to the circuitry input node;
a second conductive pad that is configured to receive the capacitively coupled second signal and is coupled to the second input node of the second stage; and an insulator disposed over at least a portion of the second conductive pad;
wherein the circuitry has a circuitry output node;
a third stage having a third input node coupled to the circuitry output node and configured to couple a third signal from the circuitry output node to the first conductive pad; and
a fourth stage having a fourth input node coupled to the circuitry output node and configured to couple a fourth signal from the circuitry output node to the second conductive pads.

30. A tester, comprising:
a first probe configured to receive a non capacitively coupled first signal;
test circuitry having a circuitry input node;
a first stage having a first input node coupled to the first probe and configured to couple the first signal to the circuitry input node;
a second stage having a second input node configured to receive a capacitively coupled second signal through a capacitive element such that a first node of the capacitive element is coupled to the second stage and a second node of the capacitive element is coupled to receive the second signal, the second stage configured to couple the second signal to the circuitry input node;
first and second circuit input/output nodes configured to receive the first and second signals, respectively, and respectively coupled to the first and second input nodes of the first and second stages; and
a buffer having an input node coupled to the circuitry input node and having an output node coupled to the first and second circuit input/output nodes.

31. The tester of claim 30 wherein the probe is configured to receive the capacitively coupled second signal and is coupled to the second input node of the second stage.

32. The tester of claim 30, further comprising a second probe that is configured to receive the capacitively coupled second signal and is coupled to the second input node of the second stage.

33. The tester of claim 30, further comprising:
a second probe that is configured to receive the capacitively coupled second signal and is coupled to the second input node of the second stage; and
an insulator disposed over at least a portion of the second probe.

34. The tester of claim 30, further comprising:
wherein the test circuitry has a circuitry output node; and
a third stage having a third input node coupled to the circuitry output node and configured to couple a third signal from the circuitry output node to the first probe.

35. The tester of claim 30, further comprising:
a second probe that is configured to receive the capacitively coupled second signal and is coupled to the second input node of the second stage;
an insulator disposed over at least a portion of the second probe;
wherein the circuitry has a circuitry output node; and
a third stage having a third input node coupled to the circuitry output node and configured to couple a third signal from the circuitry output node to the first and second probes.

36. A tester, comprising:
a first probe configured to receive a non capacitively coupled first signal;
test circuitry having a circuitry input node;
a first stage having a first input node coupled to the probe and configured to couple the first signal to the circuitry input node;
a second stage having a second input node configured to receive a capacitively coupled second signal, the second stage configured to couple the second signal to the circuitry input node;
a second probe that is configured to receive the capacitively coupled second signal and is coupled to the second input node of the second stage; and
an insulator disposed over at least a portion of the second probe;
wherein the circuitry has a circuitry output node;
a third stage having a third input node coupled to the circuitry output node and configured to couple a third signal from the circuitry output node to the first probe; and
a fourth stage having a fourth input node coupled to the circuitry output node and configured to couple a fourth signal from the circuitry output node to the second probe.

37. A system, comprising:
a device, comprising:
a first conductor configured to receive a non capacitively coupled first signal;
circuitry having a circuitry input node;
a first stage having a first input node coupled to a conductive pad and configured to couple the first signal to the circuitry input node;
a second stage having a second input node configured to receive a capacitively coupled second signal through a capacitive element such that a first node of the capacitive element is coupled to the second stage and a second node of the capacitive element is coupled to receive the second signal, the second stage configured to couple the second signal to the circuitry input node;
first and second circuit input/output nodes configured to receive the first and second signals, respectively, and respectively coupled to the first and second input nodes of the first and second stapes; and
a buffer having an input node coupled to the circuitry input node and having an output node coupled to the first and second circuit input/output nodes; and
a first integrated circuit coupled to the device.

38. The system of claim 37 wherein:
the device comprises a second integrated circuit; and
the first conductor comprises a first conductive pad.

39. The system of claim 37 wherein:
the device comprises a tester; and
the first conductor comprises a first probe.

40. The system of claim 37 wherein the first integrated circuit comprises a processor.

41. The system of claim 37 wherein the first conductor is configured to receive the capacitively coupled second signal and is coupled to the second input node of the second stage.

42. The system of claim 37 wherein the device further comprises a second conductor that is configured to receive the capacitively coupled second signal and is coupled to the second input node of the second stage.

43. The system of claim 37 wherein the device further comprises:
a second conductor that is configured to receive the capacitively coupled second signal and is coupled to the second input node of the second stage; and
an insulator disposed over at least a portion of the second conductive pad.

44. The system of claim 37, further comprising:
wherein the device further comprises a second conductor that is configured to receive the capacitively coupled second signal and is coupled to the second input node of the second stage;
wherein the first integrated circuit comprises a conductive pad aligned with the second conductor, the first integrated circuit configured to generate the second signal on the conductive pad; and
an insulator disposed between the conductive pad and the second conductor.

45. The system of claim 37 wherein the first integrated circuit comprises a conductive pad in contact with the first conductor, the first integrated circuit configured to generate the first signal on the conductive pad.

46. The system of claim 37, further comprising:
wherein the device comprises a second conductor coupled to the second input node of the second stage;
wherein the first integrated circuit comprises a first conductive pad in contact with the first conductor, the first integrated circuit configured to generate the first signal on the first conductive pad;
wherein their first integrated circuit comprises a second conductive pad and is configured to generate the second signal on the second conductive pad; and
a capacitor coupled between the second conductive pad and the second conductor.

* * * * *

UNITED STATES PATENT AND TRADEMARK OFFICE
CERTIFICATE OF CORRECTION

| | | |
|---|---|---|
| PATENT NO. | : 8,773,162 B2 | Page 1 of 1 |
| APPLICATION NO. | : 12/980832 | |
| DATED | : July 8, 2014 | |
| INVENTOR(S) | : Roberto Canegallo et al. | |

It is certified that error appears in the above-identified patent and that said Letters Patent is hereby corrected as shown below:

In the Claims

Column 18, line 18, Claim 23, the phrase "of the first and second stapes; and" should read --of the first and second stages; and--

Column 20, line 41, Claim 37, the phrase "of the first and second stapes; and" should read --of the first and second stages; and--

Column 21, line 23, Claim 46, the phrase "wherein their first integrated circuit" should read --wherein the first integrated circuit--

Signed and Sealed this
Ninth Day of December, 2014

Michelle K. Lee
*Deputy Director of the United States Patent and Trademark Office*